(12) United States Patent
Yu et al.

(10) Patent No.: US 9,001,308 B2
(45) Date of Patent: Apr. 7, 2015

(54) PATTERN GENERATOR FOR A LITHOGRAPHY SYSTEM

(71) Applicants: Chen-Hua Yu, Hsinchu (TW); Tien-I Bao, Dayuan Township, Taoyuan County (TW); Chih Wei Lu, Hsinchu (TW); Jaw-Jung Shin, Hsinchu (TW); Shy-Jay Lin, Jhudong Township (TW); Burn Jeng Lin, Hsinchu (TW)

(72) Inventors: Chen-Hua Yu, Hsinchu (TW); Tien-I Bao, Dayuan Township, Taoyuan County (TW); Chih Wei Lu, Hsinchu (TW); Jaw-Jung Shin, Hsinchu (TW); Shy-Jay Lin, Jhudong Township (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/757,477

(22) Filed: Feb. 1, 2013

(65) Prior Publication Data

US 2014/0220494 A1    Aug. 7, 2014

(51) Int. Cl.
*G03F 7/20* (2006.01)

(52) U.S. Cl.
CPC ............... *G03F 7/2051* (2013.01); *G03F 7/20* (2013.01)

(58) Field of Classification Search
USPC .................. 430/325, 396; 355/67; 250/396 R
See application file for complete search history.

(56) References Cited

U.S. PATENT DOCUMENTS

| 6,870,172 | B1 | 3/2005 | Mankos et al. |
| 7,755,061 | B2 | 7/2010 | Grella et al. |
| 2014/0212815 | A1* | 7/2014 | Hsiao et al. ................... 430/296 |

* cited by examiner

*Primary Examiner* — Caleen Sullivan
(74) *Attorney, Agent, or Firm* — Haynes and Boone, LLP

(57) ABSTRACT

A pattern generator includes a minor array plate having a mirror, at least one electrode plate disposed over the minor array plate, a lens let disposed over the minor, and at least one insulator layer sandwiched between the mirror array plate and the electrode plate. The electrode plate includes a first conducting layer and a second conducting layer. The lens let has a non-straight sidewall formed in the electrode plate. The pattern generator further includes at least one insulator sandwiched between two electrode plates. The non-straight sidewall can be a U-shaped sidewall or an L-shaped sidewall.

20 Claims, 8 Drawing Sheets

PATTERN GENERATOR FOR A LITHOGRAPHY SYSTEM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Scaling down presents difficulties, especially with lithography system. For example, light diffraction in an optical lithography system becomes an obstacle for further scaling down a feature size. Charged particle beam lithography systems can be another alternative to scale down the feature size, but these systems often suffer from reduced throughput. Accordingly, what is needed is a method to increase wafer throughput in a lithography system, such as a charged particle beam lithography system.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
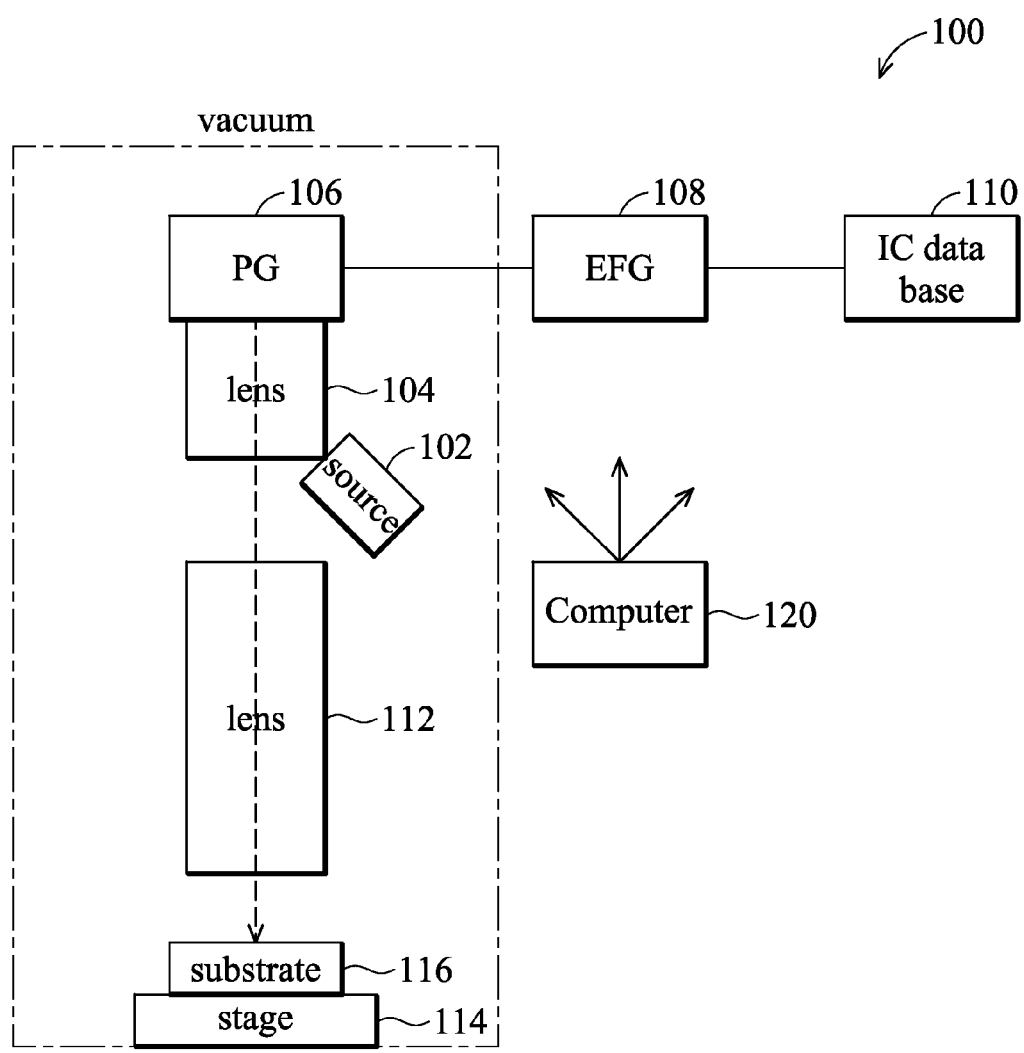
FIG. 1 is a block diagram of lithography system that can benefit from one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a lithography system 100 is an example of a system that can benefit from one or more embodiments of the present disclosure. In the present embodiments, a lithography system is also referred to as an exposing system or an exposing tool. The lithography system 100 includes a source 102, a condenser lens column 104, a pattern generator (PG) 106, an electric field generator (EFG) 108, an integrated circuit (IC) design database 110, a projection lens column 112, a stage 114, and a substrate 116. In the present embodiments, a lithography system is also referred to as an exposing system. It is understood that other configurations and inclusion or omission of various items in the system 100 may be possible. The system 100 is an example embodiment, and is not intended to limit the present invention beyond what is explicitly recited in the claims.

The source 102 provides a radiation beam, such as an electron beam or an ion beam. The source 102 may include an ion source or an electron source. In one embodiment, the electron source includes a cathode, an anode, and an aperture. The electron source provides a plurality of electron beams emitted from a conducting material by heating the conducting material to a very high temperature, where the electrons have sufficient energy to overcome a work function barrier and escape from the conducting material (thermionic sources), or by applying an electric field (potential) sufficiently strong that the electrons tunnel through the work function barrier (field emission sources). A high electric potential is applied between the cathode and the anode, which accelerates the electrons towards and through the aperture. The value of the applied electric potential determines the energy level of the electron beams that reach a substrate secured on a stage.

The condenser lens column 104 focuses the radiation beams from a source and guides the radiation beams to the pattern generator 106. In some embodiments, the radiation beams are parallel to each other after passing through the condenser lens column 104. In other embodiments, the condenser lens column 104 may include a plurality of electromagnetic apertures, electrostatic lenses, and electromagnetic lenses.

The pattern generator 106 is configured to connect to the electric field generator 108 and to the IC design database 110. In some embodiments, the pattern generator 106 includes a mirror array plate, at least one electrode plate disposed over the mirror array plate, and at least one insulator sandwiched between the mirror array plate and the electrode plate or between the electrode plates. The mirror array plate includes a plurality of mirrors connecting the electric field generator 108, the electrode plate includes a plurality of lens lets, and the insulator layer includes an insulator. The pattern generator 106 provides the patterned radiation beams according to a design layout by reflecting or absorbing a radiation beam guided to each lens let by the condenser lens column 104. The pattern generator 106 will be discussed in more detail below.

The electric field generator 108 connects to a mirror embedded into a mirror array plate of the pattern generator 106 and to the IC design database 110. The electric field generator 108 turns mirrors on or off according to the IC design database 110 by reflecting or absorbing a radiation beam. In one embodiment, the radiation beam includes an electron beam or an ion beam.

The IC design database 110 connects to the electric field generator 108. The IC designed IC database 110 includes an IC design layout. In the present embodiments, an IC design layout includes one or more IC design features or patterns.

The IC design layout is presented in one or more data files having the information of geometrical patterns. In one example, the IC design layout is expressed in a "gds" format. The IC design database 110 controls the electric field generator 108 according to the IC design layout and therefore controls the pattern generator 106 to provide the patterned radiation beams.

The projection lens column 112 guides the patterned radiation beams generated from the pattern generator 106 to the substrate 116 secured on the stage 114. In some embodiments, the projection lens column 112 includes a plurality of electromagnetic apertures, electrostatic lenses, electromagnetic lenses, and deflectors.

The stage 114 secures the substrate 116 by vacuum, and provides accurate movement of the substrate 116 in X, Y and Z directions during focusing, leveling, and exposing the substrate 116 in the electron lithography system 100. In some embodiments, the stage 114 includes a plurality of motors, roller guides, and tables.

The lithography system 100 is operated under a high vacuum condition. Therefore, the lithography system 100 may include one or more vacuum pumps, such as a mechanical pump for a low vacuum and an ion pump for a high vacuum.

The lithography system 100 also includes a computer 120 with a processor, a memory and I/O. The computer 120 is connected to the source 102, the PG 106, the EFG 108, the database 110 and/or the stage 114, for performing one or more of the operations described herein.

Figure 2:
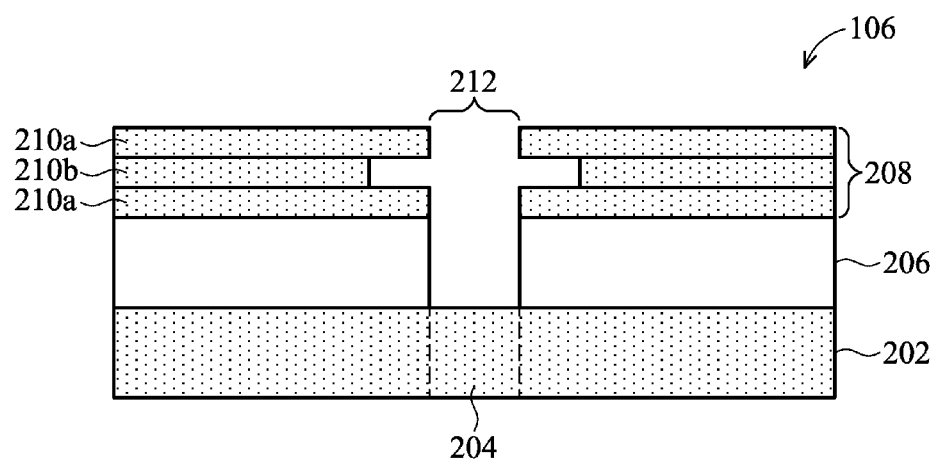
FIGS. 2 and 3 are cross sectional views of a pattern generator of a lithography system for implementing one or more embodiments.
Figure 3:
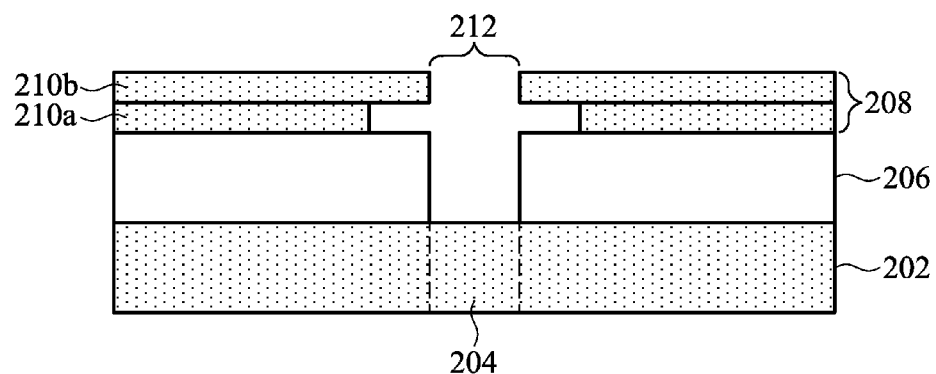

FIGS. 2 and 3 present two different embodiments of the pattern generator 106. The different embodiments may have the different advantages, and no particular advantage is necessarily required of any embodiment. The pattern generator 106 includes a mirror array plate 202, a mirror 204 embedded into the mirror array plate 202, at least one insulator layer 206 disposed over the mirror array plate 202, and at least one electrode plate 208 having at least one first conducting plate 210a and at least one second conducting plate 210b, and a lens let 212 disposed over the mirror 204. It is understood that other configurations and inclusion or omission of various items in the pattern generator 106 may be possible.

The mirror 204 is embedded in the mirror array plate 202 and is connected to the electric field generator 108, which is further connected to the IC design database 110. The mirror 204 can be turned in an "on" or "off" state changing an electric potential, for reflecting or absorbing a radiation beam, such as an electron beam. It is a choice of design as to whether the "on" state refers to reflecting or absorbing the radiation beam, as well as what electric potential is used for achieving such a state; similarly for the "off" state. In one embodiment, the mirror 204 is in "off" state and an electron beam projected on the mirror 204 is absorbed when a positive potential is applied to the mirror. Therefore, by turning "on" or "off" the mirror 204 according to an IC design layout, a patterned electron beam is generated by the pattern generator 106.

As shown in FIGS. 2 and 3, the insulator plate 206 is disposed over the mirror array plate 202 and the electrode plate 208 is disposed over the insulator plate 206. As shown in the figures, one pair of the insulator plate 206 and the electrode plate 208 are formed on the isolator 206, disposed over the mirror array plate 202 as shown in FIG. 2. In other embodiments, more than one pair of the insulator and the electrode plate can be disposed over the mirror array plate 202. Also in some embodiments, the insulator 206 includes an organic or inorganic non-conductive material, such as air, silicon oxide, silicon nitride, polymer or other suitable material.

The electrode plate 208 is disposed over the insulator plate 206 and configured to be parallel to the mirror array plate 202. As shown in the embodiment of FIG. 3, the electrode plate 208 may include a single first conducting layer 210a and a single second conducting layer 210b. Additional conducting layers may be used in other embodiments. For example, as shown in the embodiment of FIG. 2, the electrode plate 208 includes two first conducting layers 210a and one second conducting layer 210b sandwiched there between. In another example, the electrode plate 208 may include more than one first conducting layer 210a and one second conducting layer 210b alternatively disposed over the insulator plate 206. In some embodiments, the first conducting layer 210a includes a metal, a metal alloy, or a metal compound; and the second conducting layer 210b includes a metal, a metal alloy, or a metal compound. Other suitable conducting materials are possible.

Continuing with the present embodiments, the first conducting layer 210a is different from the second conducting layer 210b. In one embodiment, the first conducting layer 210a has a different etching rate compared to the second conducting layer 210b so that a non-straight sidewall is formed when forming a lens let in the electrode plate 208 when using a recess etching process. FIG. 3 shows an L-shape sidewall and FIG. 2 shows a U-shaped sidewall. In another embodiment, the first conducting layer 210a has a different type stress compared to the second conducting layer 210b. The corresponding opening forms the lens let 212. For example, if the first conducting layer 210a includes a tensile stress, the second conducting layer 210b may include a compressing stress; or vice versa. Thus, when forming the electrode plate 208 using the first conducting layer 210a and the second conducting layer 210b, the electrode plate 208 is flat and parallel to the mirror array plate 202 because of the compressing stress and the tensile stress can compensate for each other.

Figure 4:
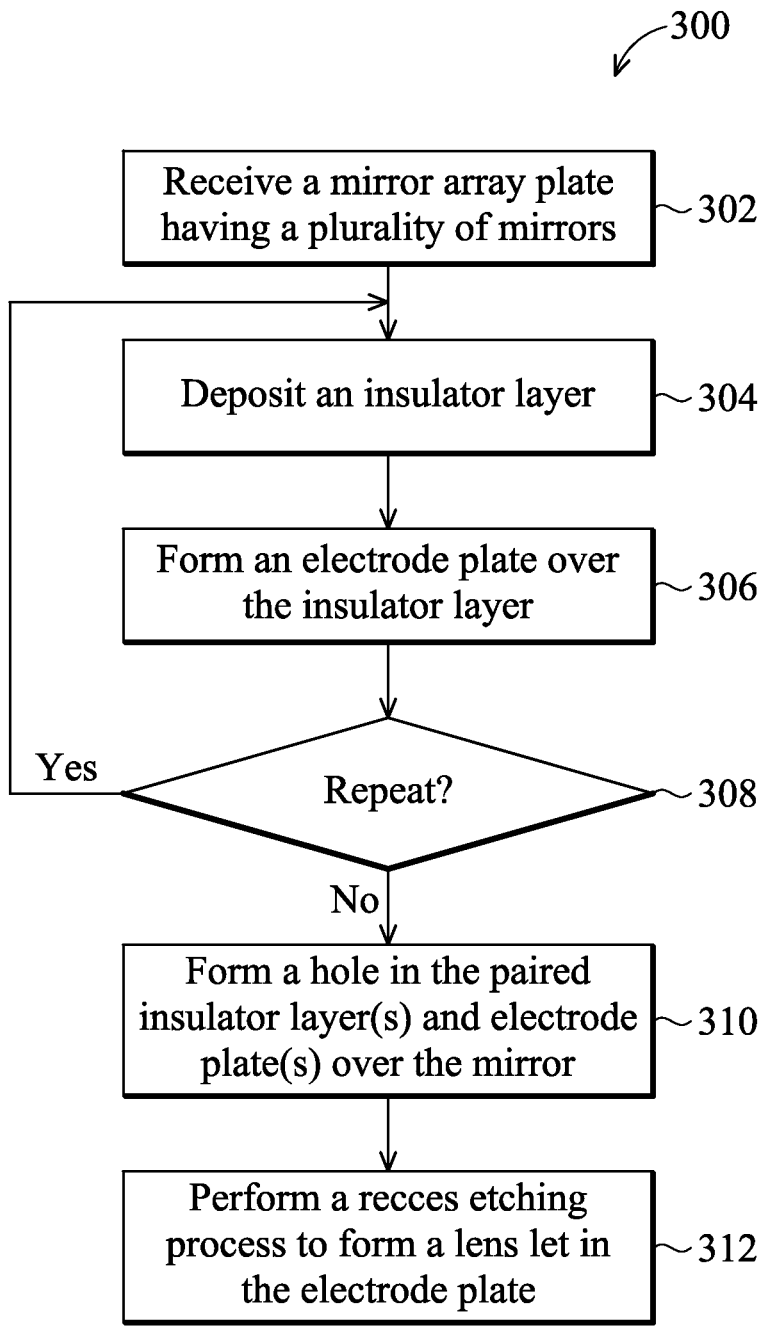
FIG. 4 is a flow chart of a method of fabricating a pattern generator according to one or more embodiments.

Referring now to FIG. 4, a flow chart of a method 300 for fabricating a pattern generator is illustrated according to one or more embodiments. It is understood that additional steps can be provided before, during, and after the method 300, and some steps described can be replaced, eliminated, or moved around for additional embodiments of the method 300. The method 300 will be further described below, and more specific embodiments of fabricating a pattern generator 400 using the method 300 will concurrently be described with reference to FIGS. 5-7.

Figure 5:
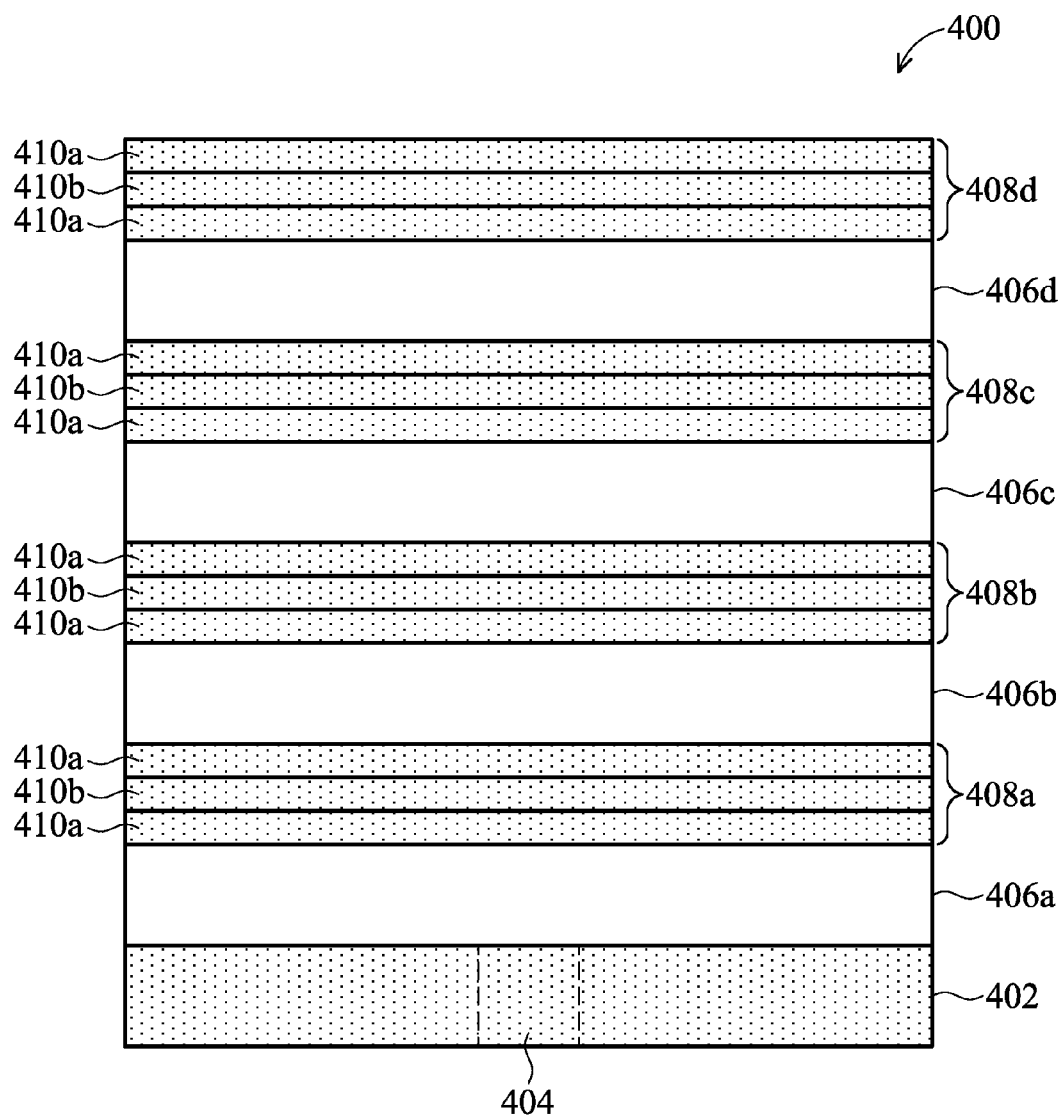
FIGS. 5-7 are cross sectional views of fabricating a pattern generator according to one or more embodiments.

The method 300 begins at step 302 by receiving a mirror array plate having a plurality of embedded mirrors. In the present embodiments, a mirror is also referred to as a pixel. Referring to FIG. 5, a mirror array plate 402 includes an embedded mirror 404. In some embodiments, the mirror 404 is connected to an electric field generator controlled by an IC design database and the mirror 404 can be turned to an "on" state or an "off" state according to the IC design database, such as is shown in FIG. 1.

The method 300 proceeds to step 304 by depositing an insulator layer over the mirror array plate. Referring again to FIG. 5, an insulator layer 406a is deposited over the mirror array plate 402 having the embedded mirror 404. In some embodiments, the insulator layer 406a includes an inorganic or organic non-conducting material, such as air, polymer, silicon oxide, silicon nitride or other suitable materials. A thickness of the insulator layer ranges from approximate 500 to 1000 nm. The insulator layer 406 can be deposited, for example, using chemical vapor deposition (CVD) or physical vapor deposition (PVD).

The method 300 proceeds to step 306 by forming an electrode plate over the insulator layer. Referring again to FIG. 5, an electrode layer 408a is deposited on the insulator layer 406a disposed over the mirror array plate 402. As discussed above, the electrode layer 408a can have various configurations, such as two first conducting layers 410a and a second conducting layer 410b sandwiched there between. One or more of the layers for the electrode 408a can include a different metal or a metal compound, such as Al, TiN, or TaN. Using the example shown in FIG. 5, the electrode plate 408a includes a tri-layer stack, with a layer of Al (410b) surrounded by layers of TiN (410a). The layers 410 can be deposited, for example, using CVD or PVD, with an overall thickness of the electrode plate 408a ranging from approximate 50 to 500 nm.

The method 300 proceeds to step 308 to determine if steps 304 and 306 are to be repeated. In the embodiment of FIG. 5, the steps 304/306 are repeated four times. Referring again to FIG. 5, four pairs of alternative insulator layers 406a-d and electrode plates 408a-d are formed on the mirror array plate 402 including the mirror 404 embedded in the mirror array plate 402. In some embodiments, a thickness of each electrode plate 408a, 408b, 408c or 408d may also vary, ranging from approximate 500 to 1000 nm.

Figure 6:
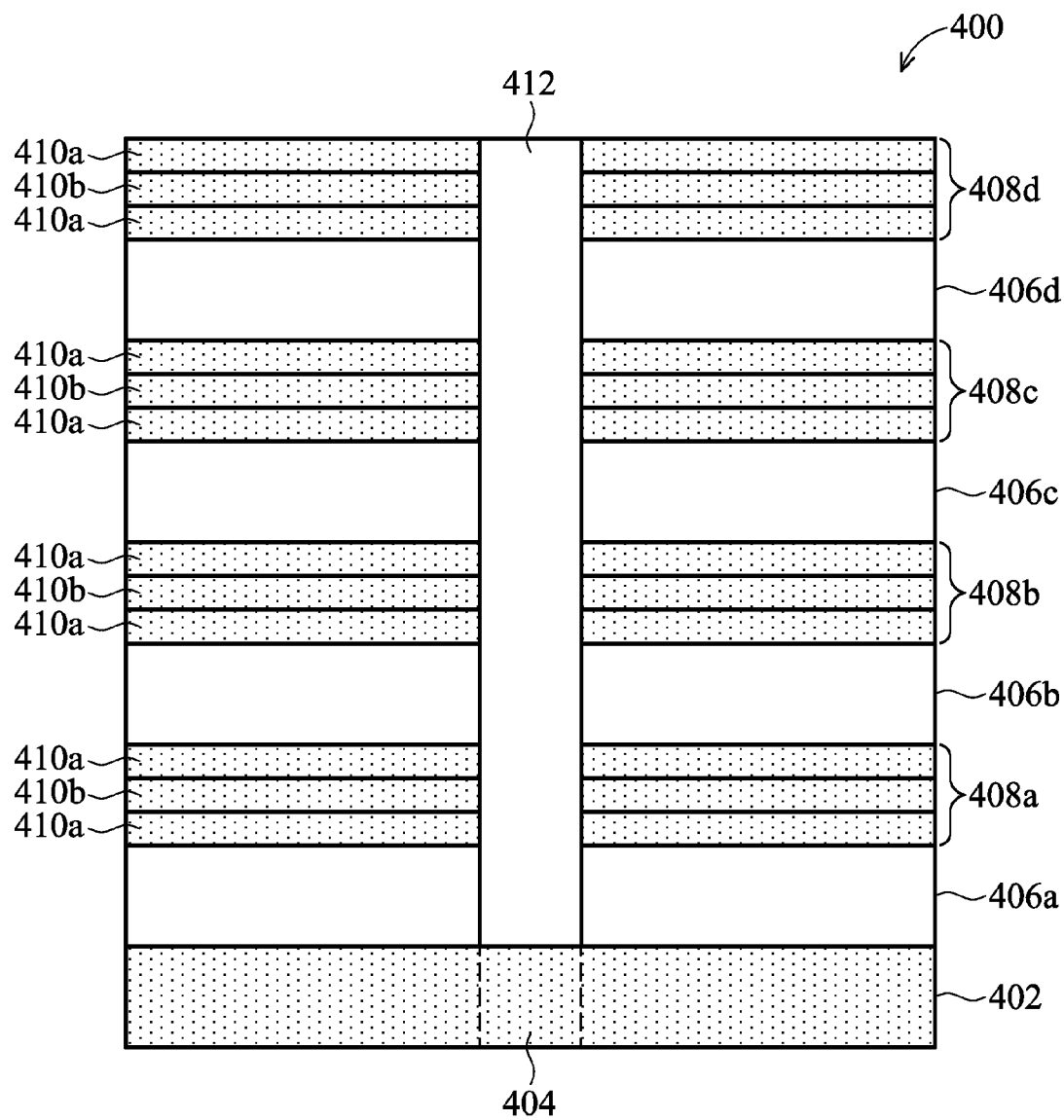

The method 300 proceeds to step 310 by forming a hole in the paired insulator layer and electrode plate over a mirror embedded in a mirror array plate. Referring to FIG. 6, a hole 412 is formed in the paired insulator layers 406a-d and electrode plates 408a-d over the mirror 404 embedded into the mirror array plate 402. The hole 412 is aligned to the mirror 404. In one embodiment, a top view shape of the hole 412 is an oval shape with a large diameter ranging from approximate 0.5 to 1.2 μm. Other embodiments include a square or rectangle shape with a large dimension at approximate 0.5~1.2× 0.5~1.2 μm². Other shapes are possible. One way of forming the hole 412 is using a conventional patterning process, such as including lithography, etching, and cleaning.

Figure 7:
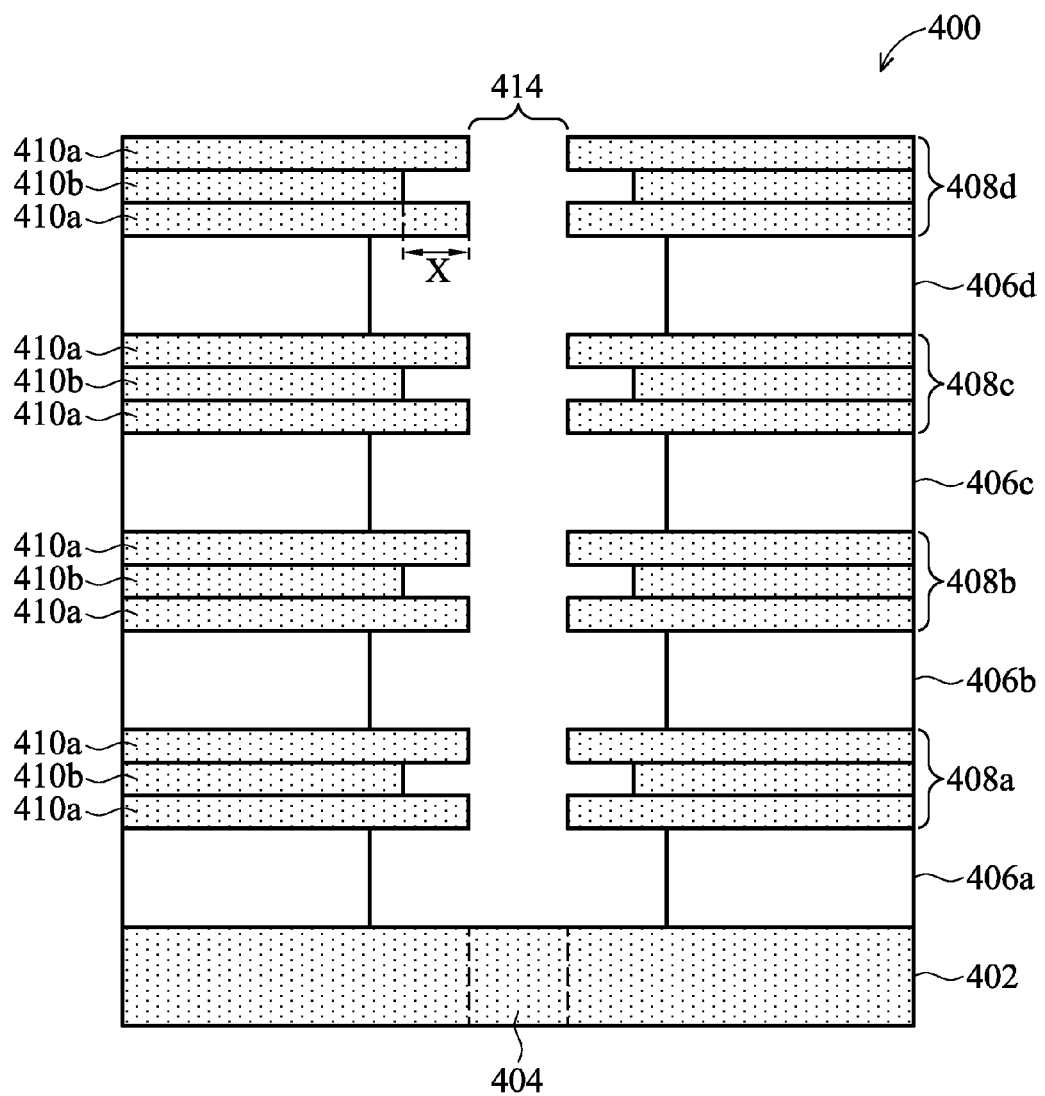

The method 300 proceeds to step 312 by performing a recess-forming process to form a lens let having a non-straight sidewall, such as a U-shaped sidewall. Referring to FIG. 7, a lens let 414 with a U-shaped sidewall having a recess depth x is formed in the electrode plates 408a-d paired with the insulator layers 406a-d respectively. The recess depth x ranges from approximate 0 to 250 nm in a tri-layer stacked electrode plate, such as TiN/Al/TiN stacked electrode plate. In another embodiment, the insulator layers 406a-d may lose additional material during the recess-forming process, as shown in FIG. 7.

One way of performing a recess-forming process is using a wet etching process. In one embodiment, insulator layers 406 each include undoped silicate glass (USG) with a thickness at proximate 700 nm, and the electrode plates 408 each includes a tri-layer of TiN (approximate 50 nm)/Al (approximate 200 nm)/TiN (approximate 50 nm). In this embodiment, hydrogen fluoride (HF) with a concentration at approximate 24.5% can be used for performing a recess-forming process. The etching rate is approximate 80 nm per minute for Al, 1-2 nm per minute for TiN, and 330 nm per minute for USG. In this embodiment, approximate 60 nm of Al and 250 nm of USG are recessed.

According to one or more embodiments, when radiation beams, such as electron beams, are guided to pass a lens let by an electric field generated by an electrode plate, some of the electron beams are blocked because of the dimension limitation of the lens let. If a lens let having a non-straight sidewall, such as a U-shaped sidewall, in the electrode plate is used, an electric field generated by an electrode plate can force or push the electron beam to a center axis of the lens let. As a result of pushing electron beam to the center axis of the lens let, more electron beams are guided to pass through the following projection lens column to the substrate. Therefore, an efficiency of the projection lens column from a pattern generator is increased by the U shaped sidewall of the lens let.

In one embodiment, an emitting angular distribution from a lens let is used to evaluate a pattern generator. In this embodiment, the less emitting angular distribution indicates that more electron beams are passing through a following projection lens column to the wafer substrate, and therefore the pattern generator has a higher efficiency of the whole system explained in the next section. For example, a lens let having a U-shaped sidewall in an electrode plate has approximate 23 mrad emitting angular distribution with no recess, 20 mrad emitting angular distribution with a recess of about 50 nm, 19 mrad emitting angular distribution with a recess of about 100 nm, and 19 mrad emitting angular distribution with a recess of about 200 nm.

In another embodiment, a lens let having a U-shaped sidewall in an electrode plate also improves efficiency of a projection lens column. In this embodiment, when the projection lens column having an approximate 16 mrad of numerical aperture (NA) is used, the efficiency of a projection lens column is approximate 47.2% with a zero recess, 53.4% with a recess of about 50 nm, 54.4% with a recess of about 100 nm, and 54.9% with a recess of about 200 nm. In another embodiment, when the projection lens column having an approximate 12 mrad of numerical aperture is used, the efficiency of a projection lens column is approximate 31.5% with a zero recess, 36.0% with a recess of about 50 nm, 36.5% with a recess of about 100 nm, and 36.8% with a recess of about 200 nm. In these embodiments, the efficiency of a projection column is improved by approximate 14% with a recess of approximately 60 nm in a U-shaped sidewall of a lens let.

Figure 8:
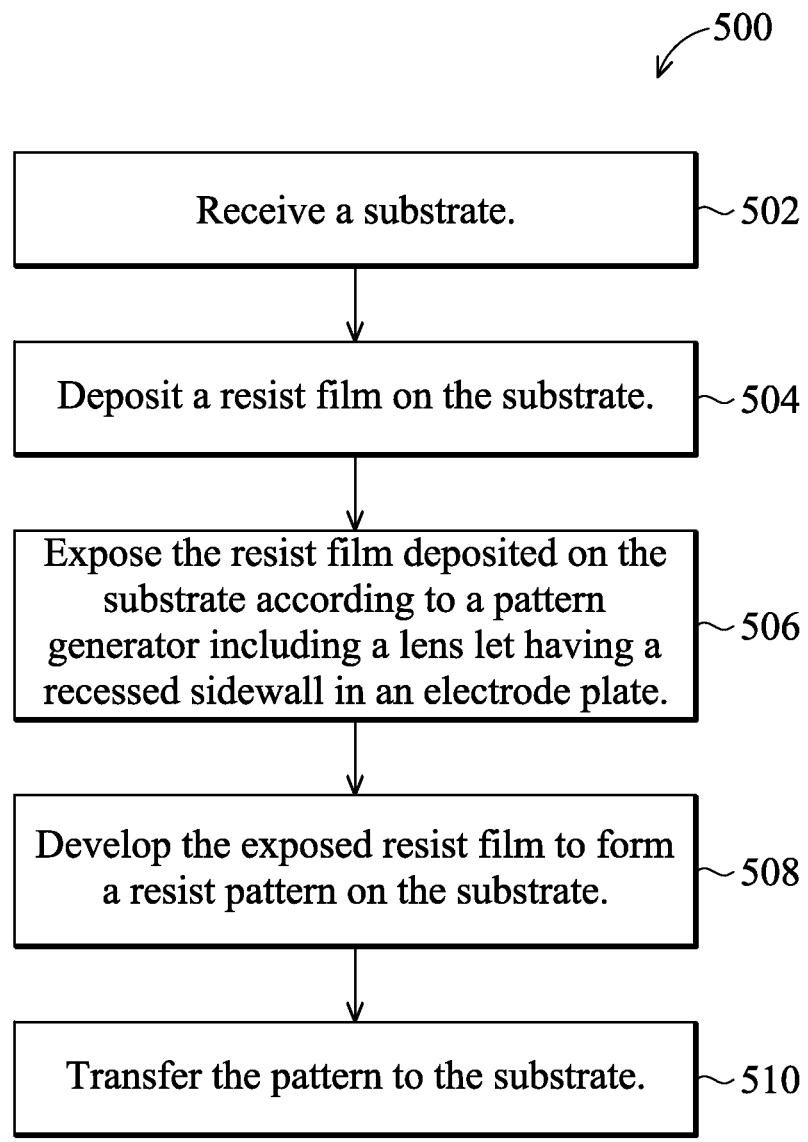
FIG. 8 is a flow chart of a method of forming a resist pattern on a substrate according to one or more embodiments.

Referring now to FIG. 8, a flow chart of a method 500 for fabricating a structure on a substrate is illustrated. It is understood that additional steps can be provided before, during, and after the method 500, and some steps described can be replaced, eliminated, or moved around for additional embodiments of the method 500. The method 500 will be further described below, and more specific embodiments of forming a structure 600 using the method 500 will concurrently be described with reference to FIGS. 9-12.

Figure 9:
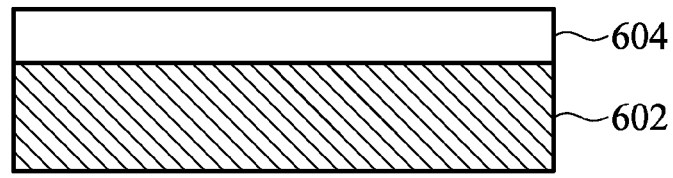
FIGS. 9-12 are cross sectional views of forming a resist pattern on a substrate according to one or more embodiments.

The method 500 begins at step 502 by receiving or providing a substrate. Referring to FIG. 9, a substrate 602 is provided. In some embodiments, the substrate 602 may include a wafer, such as a silicon wafer. Alternatively or additionally, the substrate 602 includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In other embodiments, the substrate 602 may include a mask blanket for making a photomask. A mask blanket may includes a low thermal expansion and high transparent material, such as a quartz. A mask may also include an opaque material, such as chromium (Cr) or silicon molybdenum (MoSi). A mask may be a transmittance mask, such as a binary mask (BIM), or a phase shift mask (PSM), which includes an alternative phase shift mask (alt. PSM) or an attenuated phase shift mask (att. PSM). The mask may be a reflective mask. The mask can be used in an optical lithography tool, such as an I-line, a deep ultraviolet (DUV), or an extreme ultraviolet (EUV) tool.

The method 500 proceeds to step 504 by forming a resist film on a substrate. Referring again to FIG. 9, a resist film 604 is deposited on the substrate 602. In the present embodiment, a resist film is also referred to as resist or photoresist. The resist film 604 may be a positive resist or a negative resist. The resist film 604 may include a single layer resist film or a multiple layer resist film. One way of depositing a resist film on the substrate includes using a coating process, for example a spin-on process. In the present example, depositing a resist film includes performing a dehydration process before applying the resist on the substrate, which can enhance an adhesion of the resist film to the wafer substrate. The dehydration process may include baking the substrate at a high temperature for duration of time, or applying a chemical such as hexamethyldisilizane (HMDS) to the substrate. Depositing a resist film may also include a soft bake (SB) process to drive a solvent out of a resist film and increase mechanical strength of a resist film. Depositing a resist film may include applying an antireflective coating, such as a bottom antireflective coating (BARC) or a top antireflective coating (TARC).

Figure 10:
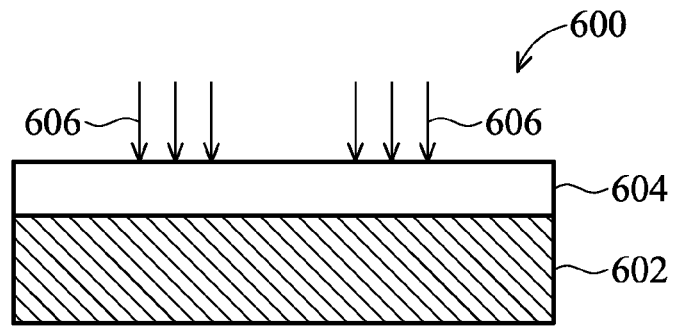

The method 500 proceeds to step 506 by exposing the resist film deposited on the substrate in the lithography system 100 having a pattern generator including a lens let having a recessed (e.g., U-shaped) sidewall in an electrode plate according to an IC design layout. Referring to FIG. 10, electron beams 606 are used to exposes the resist film 604 deposited on the substrate 602.

Figure 11:
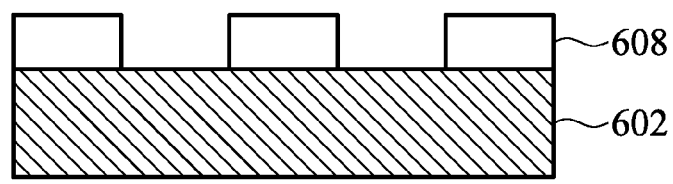
Figure 12:
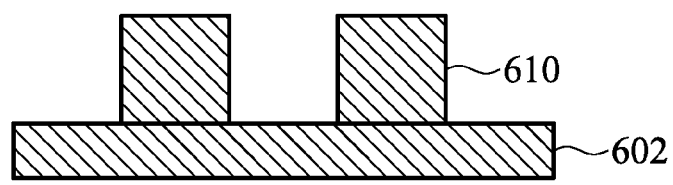

The method 500 proceeds to step 508 by applying a developer on an exposed resist film deposited on a substrate to form a resist pattern on the substrate. Referring to FIG. 11, a resist pattern 608 is formed on the substrate 602. In one embodiment, a developer includes a water based developer, such as tetramethylammonium hydroxide (TMAH), for a positive tone development (PTD). In another embodiment, a developer may include an organic solvent or a mixture of organic solvents, such as methyl a-amyl ketone (MAK) or a mixture involving the MAK, for a negative tome development (NTD). Applying a developer includes spraying a developer on the exposed resist film, for example by a spin-on process. Applying a developer also include using a post exposure bake (PEB), a post develop bake (PDB) process, or a combination thereof.

The method 500 proceeds to step 510 by transferring the resist pattern to the substrate. Referring to FIG. 11, a substrate pattern 610 is formed on the substrate 602. In some embodiments, transferring the resist pattern to the substrate includes performing an etching process on the resist pattern, removing the resist, and forming a substrate pattern or feature on the substrate. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etching process may further include using a cleaning process.

Thus, the present disclosure describes a pattern generator. The pattern generator includes a mirror array plate having a mirror, at least one electrode plate disposed over the mirror array plate, wherein the electrode plate includes at least one first conducting layer and at least one second conducting layer, a lens let disposed over the mirror, wherein the lens let includes a non-straight sidewall formed in the electrode plate, and at least one insulator layer sandwiched between the mirror array plate and the electrode plate. The pattern generator further includes one insulator sandwiched between two electrode plates. The electrode plate is parallel to the mirror array plate. The non-straight sidewall includes a U-shaped sidewall or an L-shaped sidewall. The electrode plate includes two first conducting layers and one second conducting layer sandwiched between the two first conducting layers. The first conducting layer is different from the second conducting layer. The first conducting layer includes a different etching rate compared to the second conducting layer. The first conducting layer includes a different stress compared to the second conducting layer. The lens let aligns to the mirror.

In some embodiments, a method for fabricating a resist pattern is described. The method includes receiving a substrate, depositing a resist film on the substrate, exposing the resist film deposited on the substrate according to a pattern generator, and forming the resist pattern on the substrate by developing the exposed resist film. The pattern generator includes, a mirror array plate having a mirror, at least one insulator layer disposed over the mirror array plate, at least one electrode plate disposed over the insulator plate, where in the electrode plate includes at least one first conducting layer and at least one second conducting layer, and a lens let formed over the mirror, wherein the lens let includes a non-straight sidewall formed in the electrode plate. The method further includes using an integrated circuit (IC) design database having a feature and an electric field generator connected the PG for controlling whether the lens let reflects or absorbs the radiation beam in response to the feature. The insulator layer includes a non-conducting inorganic or organic material. The first conducting layer includes a metal or a metal compound. The second conducting layer includes a metal or a metal compound. The source includes an electron source or an ion source. The non-straight sidewall includes a U-shaped sidewall.

In one or more embodiments, a method for fabricating a pattern generator is represented. The method includes receiving a mirror array plate having a mirror, depositing at least one insulator layer over the mirror array plate, forming at least one electrode plate over the insulator layer, wherein forming the electrode plate including depositing at least one first conducting layer over the insulator and at least one second conducting layer over the first conducting layer, and forming a lens let over the mirror, wherein forming the lens let include performing a recess etching to form a non-straight sidewall in the electrode plate. The method further includes forming a resist pattern on a substrate using the pattern generator, wherein the substrate includes a wafer or a mask blanket. Forming the electrode plate includes forming a tri-layer electrode plate having two first conducting layers sandwiching one second conducting layer. Forming the non-straight sidewall includes forming a U-shaped sidewall in the electrode plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A pattern generator comprising:
a mirror array plate including a mirror;

a first electrode plate disposed over the mirror array plate, wherein the first electrode plate includes at least one first conducting layer and at least one second conducting layer;

a lens let disposed over the mirror, wherein the lens let includes a non-straight sidewall formed in the first electrode plate; and a first insulator layer sandwiched between the mirror array plate and the first electrode plate.

2. The pattern generator of claim 1, further comprising:

a second insulator layer disposed over the first electrode plate; and a second electrode plate disposed over the second insulator layer;

wherein the lens let also includes a non-straight sidewall formed in the second electrode plate.

3. The pattern generator of claim 1, wherein the electrode plate is parallel to the mirror array plate.

4. The pattern generator of claim 1, wherein the non-straight sidewall includes a U-shaped sidewall or an L-shaped sidewall.

5. The pattern generator of claim 1, wherein the electrode plate includes two first conducting layers and one second conducting layer sandwiched between the two first conducting layers.

6. The pattern generator of claim 1, wherein the first conducting layer is different from the second conducting layer.

7. The pattern generator of claim 6, wherein the first conducting layer includes a different etching rate compared to the second conducting layer.

8. The pattern generator of claim 6, wherein the first conducting layer includes a different stress compared to the second conducting layer.

9. The pattern generator of claim 1, wherein the lens let aligns to the mirror.

10. A method for fabricating a pattern generator, the method comprising:

receiving a mirror array plate having a mirror;

depositing at least one insulator layer over the mirror array plate;

forming at least one electrode plate over the insulator layer, wherein forming the electrode plate including depositing at least one first conducting layer over the insulator and at least one second conducting layer over the first conducting layer; and forming a lens let over the mirror, wherein forming the lens let includes performing a recess etching to form a non-straight sidewall in the electrode plate.

11. The method of claim 10, further comprising forming a resist pattern on a substrate using the pattern generator, wherein the substrate includes a wafer or a mask blanket.

12. The method of claim 10, wherein forming the electrode plate includes forming a tri-layer electrode plate having two first conducting layers sandwiching one second conducting layer.

13. The method of claim 10, wherein forming the non-straight sidewall includes forming a U-shaped sidewall in the electrode plate.

14. A pattern generator comprising:

a mirror array plate including a mirror;

a first electrode plate disposed over the mirror array plate, wherein the first electrode plate includes at least one first conducting layer and at least one second conducting layer and, wherein the electrode plate is parallel to the mirror array plate;

a lens let disposed over the mirror, wherein the lens let includes a non-straight sidewall formed in the first electrode plate; and a first insulator layer sandwiched between the mirror array plate and the first electrode plate;

wherein the first conducting layer is different from the second conducting layer.

15. The pattern generator of claim 14, further comprising:

a second insulator layer disposed over the first electrode plate; and a second electrode plate disposed over the second insulator layer;

wherein the lens let also includes a non-straight sidewall formed in the second electrode plate.

16. The pattern generator of claim 14, wherein the non-straight sidewall includes a U-shaped sidewall or an L-shaped sidewall.

17. The pattern generator of claim 14, wherein the electrode plate includes two first conducting layers and one second conducting layer sandwiched between the two first conducting layers.

18. The pattern generator of claim 14, wherein the first conducting layer includes a different etching rate compared to the second conducting layer.

19. The pattern generator of claim 14, wherein the first conducting layer includes a different stress compared to the second conducting layer.

20. The pattern generator of claim 14, wherein the lens let aligns to the mirror.

* * * * *